United States Patent [19]

Svedberg

[11] Patent Number: 4,937,642

[45] Date of Patent: Jun. 26, 1990

[54] BIDIRECTIONAL MOS SWITCH

[75] Inventor: Per Svedberg, Vällingby, Sweden

[73] Assignee: Asea Brown Boveri AB, Västerås, Sweden

[21] Appl. No.: 314,848

[22] Filed: Feb. 24, 1989

[30] Foreign Application Priority Data

Feb. 29, 1988 [SE] Sweden ............................ 8800696

[51] Int. Cl.⁵ .......................................... H01L 29/78
[52] U.S. Cl. .................................. 357/23.7; 357/23.4; 357/23.14; 357/39; 357/41; 357/46; 357/58
[58] Field of Search ................... 357/23.4, 23.7, 23.14, 357/39, 41, 46, 58

[56] References Cited

U.S. PATENT DOCUMENTS

| 3,714,523 | 1/1973 | Bate ............................ 357/23.14 |
| 4,393,578 | 7/1983 | Cady et al. . |
| 4,553,151 | 11/1985 | Schutten et al. . |
| 4,571,513 | 2/1986 | Lade et al. . |
| 4,598,305 | 7/1986 | Chiang et al. ................. 357/23.14 |
| 4,641,164 | 2/1987 | Dolny et al. . |
| 4,656,493 | 4/1987 | Adler et al. . |
| 4,721,986 | 1/1988 | Kinzer ........................... 357/23.41 |

OTHER PUBLICATIONS

Sakuma et al.–1984 IEEE, pp. 564–568–, "Monolithic Capacitor–Coupled Gate Input High Voltage SOS/CMOS".

"Monolithic Capacitor-Coupled Gate Input High Voltage SOS/CMOS Driver Array", H. Sakuma and K. Kirata, pp. 564–568, 1984 IEEE.

Primary Examiner—Edward J. Wojciechowicz
Attorney, Agent, or Firm—Pollock, Vande Sande & Priddy

[57] ABSTRACT

A bidirectional semiconductor switch is produced in a semiconductor layer, such as silicon, arranged on an insulating base of, for example, sapphire. The switch has two highly doped main contact regions. Between these regions the switch has a voltage absorbing part comprising a weakly doped layer, located next to the surface of the semiconductor layer, of the same conductivity type as the main contact regions, and a weakly doped layer, located next to the base of the opposite conductivity type. Between each one of the contact regions and the weakly doped layer located near the surface, normally non-conducting MOS structures are arranged. By simultaneously controlling the two MOS structures to a conducting state, the switch becomes conducting and is able to carry current in an optional direction between the main contacts.

10 Claims, 5 Drawing Sheets

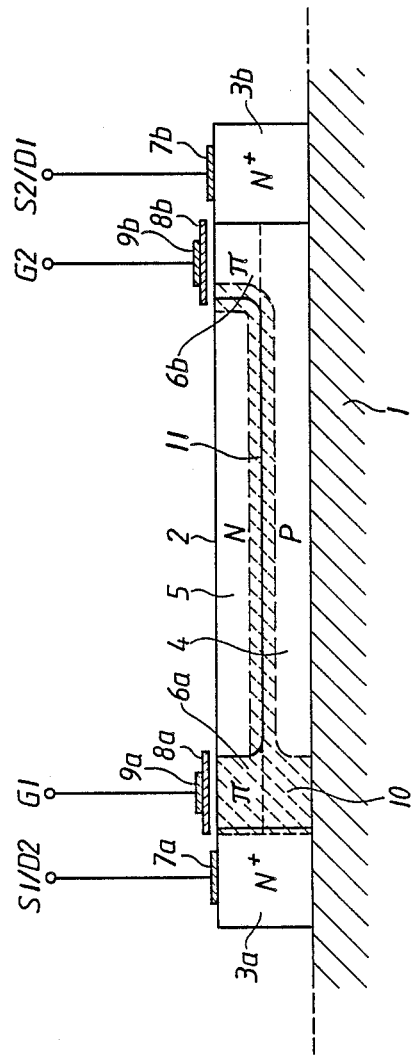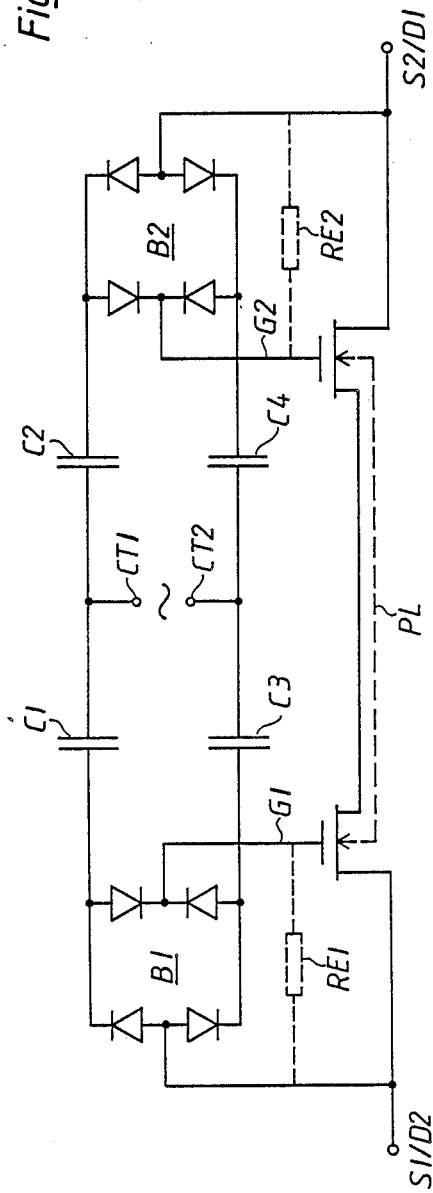

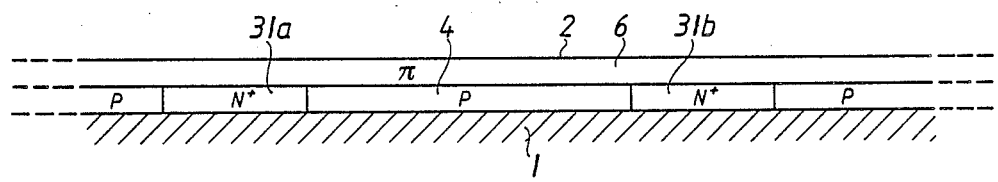
Fig. 3a
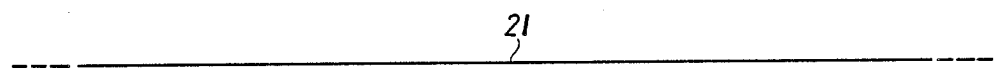
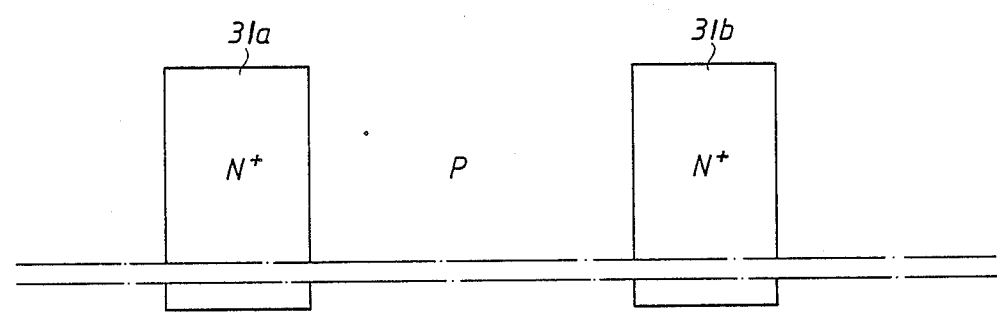
Fig. 3b

BIDIRECTIONAL MOS SWITCH

TECHNICAL FIELD

The present invention relates to a bidirectional MOS switch.

BACKGROUND ART

In many electric circuits and devices there is a need for switching means which have the maximum permissible voltage in an open state, which have low resistance in a closed state and which provide galvanic insulation between the control circuits and main circuits and between different main circuits in the same device. An example of equipment in which switching means of these kind are required is telephone equipment. In typical equipment of this kind, electromechanical relays are used as switching means, and for each telephone line arriving at a telephone station, a plurality of such relays are required, for example for connection of a ringing generator, for disconnection and connection in connection with trouble shooting, and the like. Electromechanical relays bulky, are relatively expensive, the mechanical contacts give limited reliability, for example, because of fouling of contacts, and the relays require a relatively extensive assembly and connection work during installation in the equipment in question.

From the article "Monolithic Capacitor-Coupled Gate Input High Voltage SOS/CMOS Driver Array" (H Sakuma and K Hirata) in Proceedings of the IEEE Custom Integrated Circuit Conference (IEEE CICC), 1984, pages 564–568, a unidirectional MOS switch is previously known. This switch exhibits a couple of highly doped contact regions with two intermediate, weakly doped voltage absorbing regions. Between these regions and one of the contact regions a MOS structure is formed, and with the aid of the control electrode of this structure the switch can be controlled between closed and open states. As previously mentioned, this switch is unidirectional, in that it is only able to absorb voltage in one direction. In a large number of pieces of equipment, a switching member of the current type is required to be bidirectional, that is, to be capable of absorbing voltages of both polarities and, in addition, it is required to carry current in both directions. It would be possible to achieve a bidirectional switch by series-connecting two opposed members of the type described in the above-mentioned article. The on-state resistance of such a series connection would inevitably be high, and to reduce this resistance to acceptable values, a relatively large area would be required.

SUMMARY OF THE INVENTION

The present invention aims to provide a bidirectional MOS switch of the kind described in the introductory part, which has good voltage-absorbing capacity and low on-state resistance, which is less expensive and more reliable and offers manufacturing simpler and installation than prior art electromechanical relays, which offers the possibility of integrating a plurality of switches, possibly together with additional circuit functions, into one single semiconductor capsule, and which, at a certain given on-state resistance, requires a considerably smaller semiconductor surface than series connections of prior art unidirectional MOS switches.

What characterises a MOS switch according to the invention will become clear from the appended claims.

BRIEF DESCRIPTION OF THE DRAWINGS

The invention will be described in the following with reference to FIGS. 1–6; wherein FIG. 1 shows a switch according to the present invention;

FIG. 2 shows an embodiment of the switch according to the invention, in which galvanic separation is obtained between the control circuit and the main circuit;

FIGS. 3a, 3b, 4a, 4b, 5a and 5b show successive steps in the manufacturing of a switch according to the invention.

DESCRIPTION OF THE PREFERRED EMBODIMENT

Figure 4A:
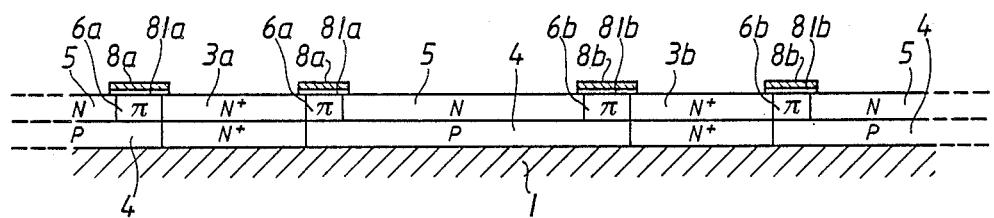

FIG. 1 shows an example of a bidirectional MOS switch according to the invention. It is manufactured by means of a so-called SOS technique (Silicon On Sapphire). On a base 1 of sapphire, a monocrystalline silicon layer 2 is applied by epitaxy. The layer can be assumed to have the shape of an elongated strip, FIG. 1 showing a section perpendicular to the longitudinal direction of the strip. The width of the layer may be about 30 μm. Its thickness can be 0.6 μm. The basic doping of the silicon layer is a very weak P-doping to an impurity concentration of about $10^{16}$ cm$^{-3}$. This doping constitutes the doping in the channel regions 6a and 6b. The layers 4 and 5 are doped to a surface concentration of $1-2 \cdot 10^{12}$ cm$^{-2}$. The contact regions 3a and 3b have a doping concentration of $10^{19}-10^{20}$ cm$^{-3}$. The contact regions are provided with metal contacts 7a, 7b which are provided with connections S1/D2 and S2/D1, respectively, which constitute the main connections of the switch. Above the channel regions 6a, 6b, control electrodes 8a, 8b are arranged on top of insulating layers (not shown). The control electrodes may, for example, be in the form of polycrystalline silicon with suitable doping and are provided with metal contacts 9a, 9b, which in turn are connected to the control connections G1 and G2.

A first MOS structure is formed from layers 3a, 6a, 5 and has the control electrode 8a. A second MOS structure is formed from layers 5, 6b, 3b and has the control electrode 8b. These two MOS structures are normally non-conducting. If, however, a sufficiently great positive voltage, for example 5 V, relative to the adjacent main contact (7a) is applied to the control electrode 8a, an N-conducting channel is formed in the channel region 6a, at the surface of the silicon layer. A corresponding situation will arise in the other MOS structure when a correspondingly positive voltage, relative to the main contact S2/D1, is applied to the control electrode G2.

The dashed lines in FIG. 1 show the extent of the barrier layer (depletion layer) that occurs in the component when the left main electrode S1/D2 has a positive polarity relative to the right main electrode S2/D1. The thickness of that part of the barrier layer 10 which is formed on either side of the PN junction 11 between layers 4 and 5 depends on the applied voltage. The figure shows the extent of the barrier layer 10 at a relatively low voltage. At an increased voltage between the main electrodes, the thickness of the barrier layer in the vertical direction increases at the junction 11 between layers 4 and 5 and will successively fill up the entire thickness of the silicon layer. At an additionally increased voltage, a horizontal field is superimposed on the vertical field until, at the breakdown voltage of the component, the field at some point becomes so high that breakdown occurs. With the above-mentioned dimensions and doping concentrations, a maximum blocking voltage of more than about 350 V can be obtained in a simple manner, as well as an on-state resistance less than some twenty or thirty ohms. The switch is completely symmetrical and can therefore be used for direct voltage of arbitrary polarity as well as for alternating voltage, that is, it is capable of taking up a blocking voltage in both directions and to carry current in both directions.

FIG. 2 shows how galvanic separation can be obtained between the main circuit of the switch and its control circuit, according to a preferred embodiment of the invention. The d.c. terminals of a diode bridge B1 are connected to the control contact G1 and the adjacent main contact S1/D2. The d.c. terminals of a diode bridge B2 are connected to the same way to the control contact G2 and the adjacent main contact S2/D1. The control signal of the switch consists of an alternating voltage which is supplied to the control connections CT1 and CT2 of the switch. The control voltage is connected to the bridge B1 via two capacitors C1 and C3 and to the bridge B2 via two capacitors C2 and C4. When the control signal is zero, the control contacts G1 and G2 are at the same potential as the adjacent main contacts and the switch is non-conducting. When a control voltage of a suitable magnitude is supplied to the control connections CT1, CT2, each control electrode becomes positive in relation to the adjacent main contact and the switch is thereby controlled to a conducting state. The diode bridges and the capacitors according to FIG. 2 can advantageously be formed integrally with the switch itself.

When the control signal (the a.c. voltage) ceases, the positive charge on the control electrodes disappears at a rate determined by the capacitance of the control electrodes and the leakage resistance of the control circuit (resistors RE1 and RE2 in FIG. 2). Alternatively, the device can be provided with double control systems, one which generates positive control signals for control of the component to a conducting state, and one which generates negative control signals for control of the component to a non-conducting state.

The dashed line PL in FIG. 2 symbolizes the connection between the main contact regions 3a, 3b via the P-layer 4.

Figure 4B:
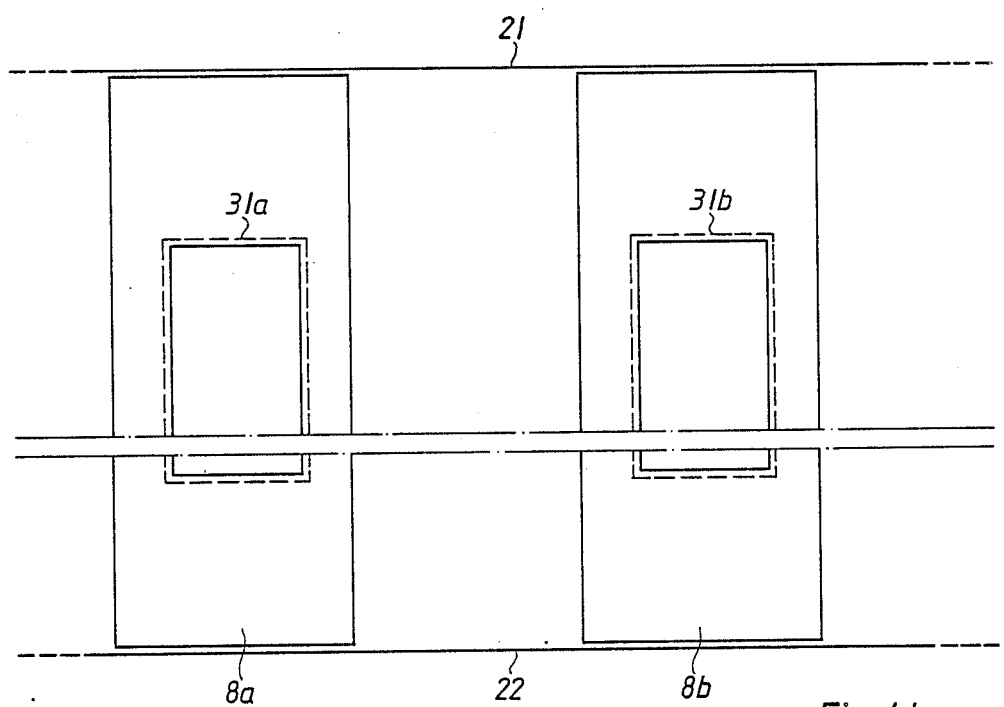
Figure 5A:
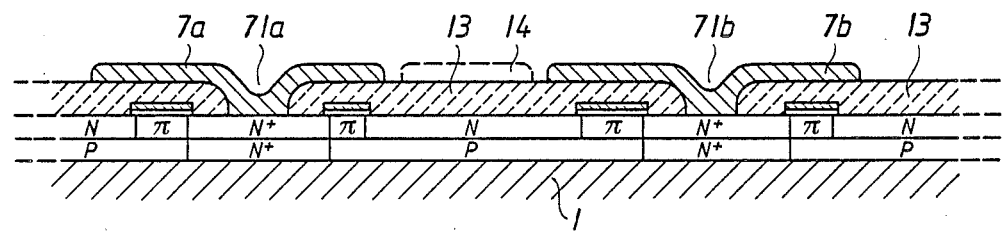
Figure 5B:
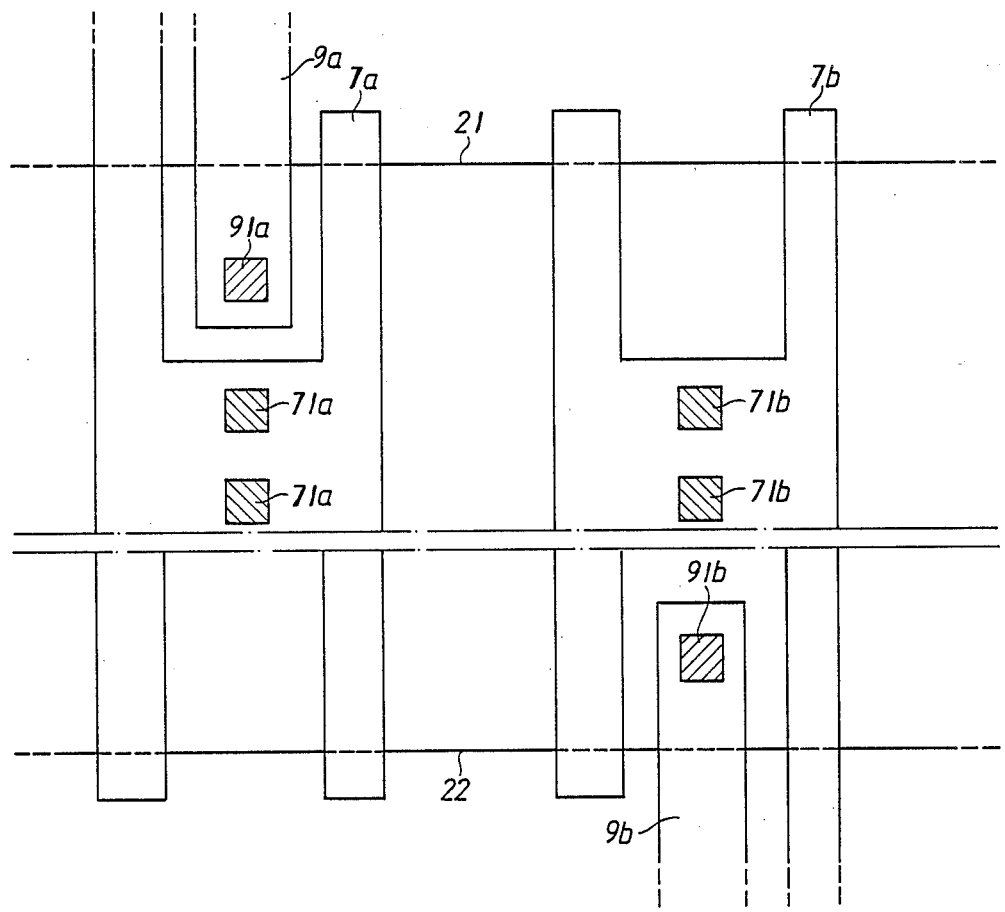

FIGS. 3a, 3b, 4a, 4b, 5a and 5b show a few steps in the manufacturing of a preferred embodiment of the invention, in which a plurality of parallel and electrically parallel-working switch elements are produced in a square or rectangular silicon layer on a sapphire base. FIGS. 3a, 4a and 5a show sections through the silicon layer, which are perpendicular to the longitudinal directions of the switch elements. FIGS. 3b, 4b and 5b show the silicon layer viewed perpendicularly to the base. The length of the individual switch elements is large in relation to their width, and for that reason only part of the extension of the elements in a longitudinal direction is shown in the figures. The omitted portions are marked in dash-dotted lines. Dimensions and dopings may be the same as have been stated in connection with FIG. 1. In FIGS. 3b, 4b and 5b the reference numerals 21 and 22 designate the edges of the silicon layer.

The starting material is weakly P-doped ($\pi$-doped). By implantation of phosphorus and boron, respectively, that part of the silicon layer which lies nearest the sapphire base 1 is doped (approximately half the thickness of the layer). Those strips 31a, 31b which will constitute the lower parts of the contact regions are heavily N-doped whereas the remainder of the lower part of the layer is relatively weakly P-doped. The result of these steps is shown in FIG. 3.

Thereafter, those thin oxide layers 81a, 81b which isolate the control electrodes from the base, and furthermore those control electrodes 8a, 8b of polycrystalline-doped silicon, which are arranged on top of these oxide layers, are generated. Using the control silicon as a mask, a shallow phosphorus implantation is thereafter made, the upper half of the silicon layer then receiving a weak N-doping. This results in the layer 5 shown in FIG. 4a. Finally, that part of the contact regions 3a, 3b which is located nearest the surface is provided with heavy N-doping. The result of these steps is shown in FIG. 4.

Thereafter, as shown in FIGS. 5a and b, a protective silicon dioxide layer 13 with a thickness of 1–3 $\mu$m is generated on the surface of the silicon layer, except on those regions (e.g. 71a, 91a) where the underlying regions are to be contacted. Thereafter, metal contacts are applied to the main contact regions and the control electrodes on top of the oxide layer 13. The contact 7a contacts the main contact region 3a within a number of regions 71a distributed along the length of the contact region. In the same way, the contact 7b contacts the contact region 3b within a number of regions 71b distributed along the length of the contact region. The control electrode 8a is contacted by the metal contact 9a within the region 91a and the control electrode 8b is contacted by the contact 9b within the region 91b.

As will be clear from FIG. 5, the main contacts 7a and 7b extend in the lateral direction beyond the two MOS structures on both sides of the contacted main contact region. The metal contacts here act as so-called field plates for control of the electric field. Additional field plates 14 (see dashed line in FIG. 5a), connected to a suitable potential, may possibly be arranged between the main contacts for control of the electric field.

Figure 6:
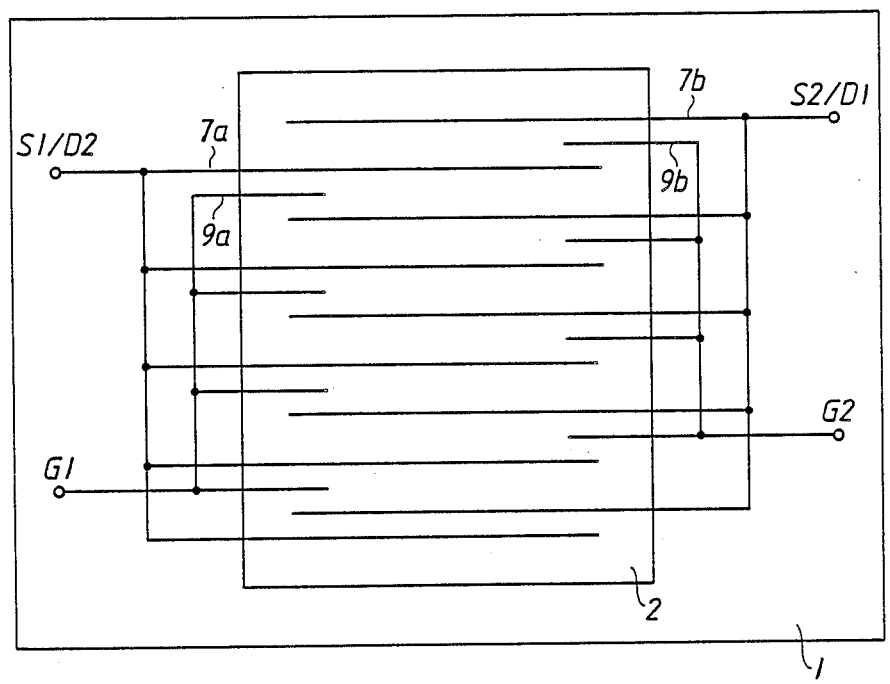
FIG. 6 shows how, in a preferred embodiment of the invention, a plurality of switch elements are formed in the same semiconductor layer and are parallel-connected to the main and control connections of the switch.

FIGS. 3–5 show only a part of the device according to the invention, namely two main contact regions 3a, 3b with adjacent MOS structures. To attain increased current handling capacity, it is suitable to arrange a plurality of switch elements side by side in the manner shown in the figures. As shown in these figures, every other main contact region and the associated control region may then have its connections extended out on one side of the layer and the intermediate main contact regions with their control regions may have their connections extended out on the opposite side of the layer. FIG. 6 shows schematically and in principle how the connections are formed in such a case. The figure schematically shows the base 1 with the silicon layer 2 arranged thereon. The silicon layer 2 contains a plurality of parallel switch elements in the manner shown in FIGS. 3–5. Every other main contact (7a) is extended out from the layer, on the lefthand side of the layer in the figure, and the intermediate main contacts (7b) are extended out on the righthand side of the layer. The connections 7a are parallel-connected to each other and connected to the main connection S1/D2 of the switch.

In a similar manner, the contacts 7b are parallel-connected to each other and connected to the other main connection S2/D1 of the switch. The control contacts 9a are connected, in parallel with each other, to the control connection G1 of the switch and the control contacts 9b are connected, in parallel with each other, to the other control connection G2 of the switch.

The length and width of the silicon layer 2 and the number of switch elements must, of course, for each particular application be selected so as to obtain a sufficiently high voltage-absorbing capacity and a sufficiently low on-state resistance.

If desired, several separate semiconductor switches according to the invention can be formed integrally with each other in one single silicon layer 2, or in several silicon layers arranged on the same base 1. This may be suitable, for example, in the initially-described application for replacement of relays in telephone equipment. In that connection, all of the relays associated with a certain telephone line may be replaced by one single integrated circuit, which will then contain as many separate semiconductor switches as are needed for replacement of the relays belonging to the line. This can result in considerable savings as to space requirement, manufacturing and installation costs and the reliability of the device. In addition to the described switches, further functions beyond the switch functions, for example logic circuits, may be integrated into the same circuit, if desired, for control of the switches.

The above description relates to an embodiment of the invention, in which the semiconductor switch is manufactured in an SOS technique, i.e. the switch is produced in a silicon layer arranged on a sapphire base. It is, of course, possible to use base materials and semiconductor materials other than these, but in this connection the SOS technique has proved to offer advantages. One of the reasons for this is that thin semiconductor layers can be manufactured in a simple manner with this technique, and these layers can be given the desired doping in a simple and accurate manner by means of implantation.

To attain a low on-state resistance of the switch, it is necessary for the weakly doped N-conducting layer 5, located near the surface, to have good conductivity. Since the doping of the layer is limited upwards by the demands for voltage absorption capacity, it is therefore essential that the mobility of the charge carriers in the layer is high, i.e. that the structure of the semiconductor material, in the layer, is as perfect as possible. The SOS technique provides good material quality and is therefore suitable to use for this reason also. If desired, the material quality of the semiconductor layer can be further enhanced, for example by the so-called DSPE technique ("Double Solid Phase Epitaxy"). According to this technique, an amorphization is first carried out with a subsequent recrystallization of that part of the semiconductor layer located nearest the base, whereby the crystal structure of that part becomes more perfect. Thereafter, an amorphization with a subsequent recrystallization of that part of the semiconductor layer which is located nearest the surface is carried out, whereby a very high perfection of that part of the semiconductor layer can be obtained.

In the embodiment described above, the two MOS structures are controlled simultaneously, that is when the switch is conducting, both structures are conducting and when the switch is non-conducting, both structures are non-conducting. In the latter case it may be advantageous to control the MOS structures such that one of them is conducting, this in order to obtain a defined potential of the N-conducting layer 5.

Further, in the above embodiment the MOS structures have been assumed to be of the type which is normally (with no control voltage applied) non-conducting and which is controlled by a control signal to conducting state. Alternatively, of course, the MOS structures may be of the type which is normally (with no control voltage applied) conducting and which is controlled by a control signal to non-conducting state. In the latter case, the component is kept non-conducting by controlling one of, or both of, the MOS structures to a non-conducting state by an applied control voltage, and the component is made conducting by removing the control voltage from both the MOS structures.

I claim:

1. A bidirectional MOS switch produced in a semiconducting layer arranged on an insulating base, said switch comprising:
    a first weakly doped region of a first conductivity type (N);
    a second weakly doped region of a second conductivity type (P), said second region being positioned between the insulating base and the first weakly doped region, said second region being contiguous with said first region and forming a PN junction therewith;
    first and second contact regions of said first conductivity type provided at opposed ends of said second weakly doped region and contiguous therewith, said contact regions being provided with main contacts;
    first and second surface-adjacent channel regions of said second conductivity type arranged between said first weakly doped region and each of said contact regions;
    said first contact region, said first channel region and said first weakly doped region forming a first MOS structure, a first control electrode for controlling the conductivity state of said first MOS structure being arranged above said first channel region and electrically insulated therefrom;
    said second contact region, said second channel region and said first weakly doped region forming a second MOS structure, a second control electrode for controlling the conductivity state of said second MOS structure being arranged above said second channel region and electrically insulated therefrom.

2. A bidirectional MOS switch according to claim 1, comprising a plurality of elongated and substantially parallel contact regions and weakly doped regions and first and second MOS structures arranged between each pair of contact regions, whereby every second contact region is connected to one of the main contacts (S1/D2) of the switch and the other contact regions are connected to the other main contact (S2/D1) of the switch.

3. A bidirectional MOS switch according to claim 1, comprising means for application of a control voltage to the control electrode of each MOS structure relative to the potential of the main contact positioned adjacent to the MOS structure.

4. A bidirectional MOS switch according to claim 1, comprising means for simultaneous application of such control voltage to the control electrodes of the two MOS structures located between a pair of contact regions (3a, 3b) that the two structures are controlled to the same conductivity state.

5. A bidirectional MOS switch according to claim 1 comprising means for capacitive transmission of a control signal to the control electrodes (8a, 8b) of the MOS structures.

6. A bidirectional MOS switch according to claim 2, comprising means for application of a control voltage to the control electrode of each MOS structure relative to the potential of the main contact positioned adjacent to the MOS structure.

7. A bidirectional MOS switch according to claim 1 comprising means (CT1, CT2, C1-C4, B1, B2, G1, G2) for simultaneous application of such control voltage to the control electrodes (8a, 8b) of the two MOS structures located between a pair of contact regions (3a, 3b) that the two structures are controlled to the same conductivity state.

8. A bidirectional MOS switch according to claim 3 comprising means for simultaneous application of such control voltage to the control electrodes of the two MOS structures located between a pair of contact regions such that the two structures are controlled to the same conductivity state.

9. A bidirectional MOS switch according to claim 2 comprising means for capacitive transmission of a control signal to the control electrodes of the MOS structures.

10. A bidirectional MOS switch according to claim 3 comprising means for capacitive transmission of a control signal to the control electrodes of the MOS structures.

* * * * *